United States Patent [19]
Ting et al.

[11] Patent Number: 5,969,422
[45] Date of Patent: Oct. 19, 1999

[54] PLATED COPPER INTERCONNECT STRUCTURE

[75] Inventors: Chiu Ting, Saratoga; Valery Dubin, Cupertino, both of Calif.

[73] Assignee: Advanced Micro Devices, Inc., Sunnyvale, Calif.

[21] Appl. No.: 08/857,129

[22] Filed: May 15, 1997

[51] Int. Cl.$^6$ ................................................. H01L 29/45
[52] U.S. Cl. ........................ 257/762; 257/768; 257/769; 257/753; 438/687; 438/685; 438/648; 438/656
[58] Field of Search ................................... 438/687, 685, 438/681, 678, 675, 674, 668, 666, 654, 618, 656; 257/754, 762, 764, 766, 768, 770, 753, 741, 748, 769

[56] References Cited

U.S. PATENT DOCUMENTS

| | | |
|---|---|---|
| 4,574,095 | 3/1986 | Baum et al. . |
| 4,789,648 | 12/1988 | Chow et al. . |
| 5,093,279 | 3/1992 | Andreshak et al. . |
| 5,098,860 | 3/1992 | Chakravorty et al. . |
| 5,240,497 | 8/1993 | Shacham et al. . |
| 5,262,354 | 11/1993 | Cote et al. . |
| 5,280,154 | 1/1994 | Cuomo et al. . |
| 5,288,951 | 2/1994 | Frankenthal et al. . |
| 5,409,587 | 4/1995 | Sandhu et al. . |
| 5,466,972 | 11/1995 | Frank et al. ............................ 257/764 |
| 5,592,024 | 1/1997 | Asyama et al. . |
| 5,654,245 | 8/1997 | Allen ..................................... 438/629 |

OTHER PUBLICATIONS

Ting, Chiu H., "Selective Electroless Metal Deposition for Integrated Circuit," *Journal of the Electrochemical Society*, vol. 136, No. 2, Feb. 1989, pp. 456–462.

Ting, Chiu H., et al, "Selective Electroless Metal Deposition for Via Hole Filling in VLSI Multilevel Interconnection Structures," *Journal of the Electrochemical Society*, vol. 136, No. 2, Feb. 1989, pp. 462–466.

Rossnagel, S. M., et al, "Metal ion deposition from ionized mangetron sputtering discharge," *Journal of the American Vacuum Society*, Jan./Feb. 1994, pp. 449–453.

Hopwood, J., et al, "Mechanisms for highly ionized magnetron sputtering," *Journal of Applied Physics*, vol. 78, No. 2, Jul. 1995, pp. 758–765.

Joshi, Rajiv V., "A New Damascene Structure for Submicrometer Interconnect Wiring," *IEEE Electron Device Letters*, vol. 14, No. 3, Mar. 1993, pp. 129–132.

Kaanta, Carter W., et al, "Dual Damascene: A Ulsi Wiring Technology," *VMIC Conference*, Jun. 11–12, 1991, pp. 144–152.

Kenney, D., et al, "A Buried–Plate Trench Cell for a 64–Mb DRAM," *Symposium on VLSI Technology Digest of Technical Papers*, 1992, pp. 14–15.

*Primary Examiner*—Caridad Everhart

[57] ABSTRACT

A high conductivity interconnect structure is formed by electroplating or electroless plating of Cu or a Cu-base alloy on a seed layer comprising an alloy of a catalytically active metal, such as Cu, and a refractory metal, such as Ta. The seed layer also functions as a barrier/adhesion layer for the subsequently plated Cu or Cu-base alloy. Another embodiment comprises initially depositing a refractory metal barrier layer before depositing the seed layer.

37 Claims, 5 Drawing Sheets

PLATED COPPER INTERCONNECT STRUCTURE

TECHNICAL FIELD

The present invention relates to a semiconductor device comprising a high conductivity interconnect structure, and to a method of forming the high conductivity interconnect structure. The present invention is applicable to high speed integrated circuits, particularly integrated circuits having submicron design features.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, normally of monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines formed in trench openings typically extend substantially horizontal with respect to the semiconductor substrate. Semiconductor "chips" comprising four or more levels of metallization are becoming more prevalent as device geometries shrink to submicron levels.

A conductive plug filling a via opening is typically formed by depositing a dielectric interlayer on a conductive layer comprising at least one conductive pattern, forming an opening through the dielectric interlayer by conventional photolithographic and etching techniques, and filling the opening with a conductive material, such as tungsten (W). Excess conductive material on the surface of the dielectric interlayer can be removed by chemical-mechanical polishing. One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line. In application Ser. No. 08/320,516 filed on Oct. 11, 1994, now U.S. Pat. No. 5,635,423 prior art single and dual damascene techniques are disclosed, in addition to several improved dual damascene techniques simultaneously forming a conductive line in electrical contact with a conductive plug for greater accuracy in forming fine line patterns with minimal interwiring spacings.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

If the interconnection node is routed over a considerable distance, e.g., hundreds of microns or more, as in submicron technologies, the interconnection capacitance limits the circuit node capacitance loading and, hence, the circuit speed. As integration density increases and feature size decreases in accordance with submicron design rules, the rejection rate due to integrated circuit speed delays approaches and even exceeds 20%.

One way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed by chemical-mechanical polishing. Al is conventionally employed because it is relatively inexpensive, exhibits low resistivity and is relatively easy to etch. However, as the size of openings for vias/contacts and trenches is scaled down to the sub-micron range, step coverage problems have arisen involving the use of Al which has decreased the reliability of interconnections formed between different wiring layers. Such poor step coverage results in high current density and enhanced electromigration. Moreover, low dielectric constant polyimide materials, when employed as dielectric interlayers, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent Al wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Copper (Cu) has recently received considerable attention as a replacement material for Al in VLSI interconnect metallizations. Cu exhibits superior electromigration properties and has a lower resistivity than Al. In addition, Cu has improved electrical properties vis-à-vis W, making Cu a desirable metal for use as a conductive plug as well as conductive wiring. However, there are also disadvantages attendant upon the use of Cu. For example, Cu metallization is very difficult to etch. Moreover, Cu readily diffuses through silicon dioxide, the typical dielectric interlayer material employed in the manufacture of semiconductor devices, and adversely affects the devices.

One conventional approach in attempting to form Cu plugs and wiring comprises the use of damascene structures employing chemical mechanical polishing, as in Chow et al., U.S. Pat. No. 4,789,648. However, due to Cu diffusion through dielectric interlayer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium tungsten (TiW), and silicon nitride ($Si_3N_4$) for encapsulating Cu. The use of such barrier materials to encapsulate Cu is not limited to the interface between Cu and the dielectric interlayer, but includes interfaces with other metals as well.

Electroless deposition has been suggested as a technique for forming interconnect structures. See, for example, "Electroless Cu for VLSI," Cho et al., MRS Bulletin, June 1993, pp. 31–38; "Selective Electroless Metal Deposition For Integrated Circuit Fabrication," Ting et al., J. Electrochem. Soc., 136, 1989, p. 456 et seq.; "Selective Electroless Metal Deposition For Via Hole Filling in VLSI Multilevel Interconnection Structures," Ting et al., J. Electrochem. Soc., 136, 1989, p. 462 et seq.; and Shacham et al., U.S. Pat. No. 5,240,497.

Electroless Cu deposition is attractive due to low processing costs and high quality Cu deposits. In addition, equipment for performing electroless metal deposition is relatively inexpensive vis-à-vis other semiconductor processing equipment for depositing metals. Electroless deposition also offers the advantageous opportunity for batch processing of wafers, thereby further reducing the cost of electroless deposition and increasing production throughput. However, electroless deposition requires a catalytic surface, i.e., seed layer, for the autocatalytic action to occur. See, for example, Baum et al., U.S. Pat. No. 4,574,095 and "Electroless Copper Deposition on Metals and Silicides," Mak, MRS Bulletin, August 1994, pp. 55–62. It is difficult to obtain reliable and reproducible electroless Cu deposition, since the seed layer surface must maintain catalytic activity for effective electroless deposition of Cu.

Copending application Ser. No. 08/587,264, now U.S. Pat. No. 5,824,599 filed Jan. 16, 1996, discloses a method of electrolessly depositing Cu in an interconnect structure, which method comprises initially depositing a barrier layer in an opening, depositing a catalytic seed layer, preferably of Cu, on the barrier layer, and then depositing a protective layer the catalytic layer encapsulating and protecting the catalytic layer from oxidation. The preferred protective material is Al which forms an Al—Cu alloy at the interface of the catalytic and protective layers, thereby encapsulating the underlying Cu. Subsequently, Cu is electrolessly deposited from an electroless deposition solution which dissolves the overlying protective alloy layer to expose the underlying catalytic Cu layer.

As the aspect ratio of contact and via openings as well as trench openings approaches 2:1 and greater, it becomes increasingly more challenging to voidlessly fill openings for contacts, vias and trenches of interconnect patterns employing conventional technology, such as magnetron sputtering techniques involving either direct current or radio frequency sputtering. Conventional attempts to improve sputtering capabilities comprise the use of a collimator as in Sandhu et al., U.S. Pat. No. 5,409,587.

A more recent approach in the evolution of high aspect ratio contact/via interconnection technology involves the ionization of sputtered metals by a high density plasma. See S. M. Rossnagel et al., "Metal ion deposition from ionized mangetron sputtering discharge," J. Vac. Sci. Technol. B 12(1), January/February 1994, pp. 449–453 and J. Hopwood et al., "Mechanisms for highly ionized magnetron sputtering," J. Appl. Phys., Vol. 78, No. 2, Jul. 15, 1995, pp. 758–765. Further attempts to improve RF induced plasma processing by generating a greater percent of ionized sputtered material employing a coil having a generally flattened surface defined by parallel conductors is disclosed by Cuomo et al., U.S. Pat. No. 5,280,154.

Although electroless deposition and electroplating offer the prospect of low cost, high throughput, high quality plated films and efficient via, contact and trench filling capabilities, the requirement for a catalytic seed layer becomes problematic, particularly in filling high aspect ratio openings. Electroless plating generally involves the controlled autocatalytic deposition of a continuous film on the catalytic surface by the interaction in solution of a metal salt and a chemical reducing agent. Electroplating comprises the electrodeposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. However, for electroless plating, very thin catalytic layers, e.g., less than 100 Å, can be employed in the form of islets of catalytic metal.

It is very difficult to form a high conductivity interconnect pattern having high aspect ratio openings employing Cu or a Cu-base alloy by electroless plating or electroplating, because catalytic seed layer materials particularly Cu, exhibits extremely poor step coverage, particularly for high aspect ratio openings, e.g., contact, via and trench openings of about 2:1 and greater. Such poor step coverage would inhibit electroplating due to discontinuities of the Cu seed layer, and inhibit electroless Cu deposition for failure of Cu to reach the bottom and lower side walls of high aspect ratio vias/contacts or trenches. In addition, Cu has poor adhesion to dielectric materials and requires encapsulation to prevent diffusion.

Accordingly, there exists a need for a low RC interconnect pattern having high aspect ratio contact, via and/or trench openings filled with Cu or a Cu-base alloy, and for an electroless plating or electroplating method for forming such a low RC interconnect pattern.

DISCLOSURE OF THE INVENTION

An object of the present invention is a semiconductor device comprising a high conductivity interconnect structure comprising Cu or a Cu-base alloy.

Another object of the present invention is a method of manufacturing a semiconductor device having a high conductivity interconnect structure, comprising electrolessly plated or electroplated Cu or a Cu-base alloy to fill openings, particularly high aspect ratio openings, for contacts, vias and/or trenches.

According to the present invention, the foregoing and other objects are achieved in part by a semiconductor device comprising: a semiconductor substrate; a dielectric interlayer formed on a level above the semiconductor substrate, which dielectric interlayer has an upper surface and an opening therein filled with conductive material forming an interconnect pattern, wherein the interconnect pattern comprises: a seed layer, comprising an alloy of a refractory metal and one or more of Ni, Co, Ag, Au, Pd, Pt, Rh or Cu, deposited in the opening; and a Cu or Cu-base alloy electroplated or electrolessly plated on the seed layer in the opening.

Another aspect of the present invention comprises a method of manufacturing a semiconductor substrate, which method comprises: forming a dielectric interlayer, comprising an upper surface, on a level above a semiconductor substrate; forming an opening in the dielectric interlayer extending to the upper surface, depositing a seed layer, comprising an alloy a refractory metal and one or more of Ni, Co, Ag, Au, Pd, Pt, Rh or Cu, in the opening and on the upper surface of the dielectric interlayer; and electroplating or electrolessly plating Cu or a Cu-base alloy on the seed layer in the opening and forming a layer on the upper surface of the dielectric interlayer.

A further aspect of the present invention a method of manufacturing a semiconductor substrate, which method comprises: forming a dielectric interlayer, comprising an upper surface, on a level above a semiconductor substrate; forming an opening in the dielectric interlayer extending to the upper surface, depositing a barrier layer, comprising an alloy, a refractory metal and one or more of Ni, Co, Ag, Au, Pd, Pt, Rh or Cu, in the opening and on the upper surface of the dielectric interlayer; depositing a Cu seed layer on a surface of barrier layer; and electroplating or electroless plating Cu or a Cu-base alloy on the seed layer on the upper surface of the dielectric layer.

Another aspect of the present invention is a method of manufacturing a semiconductor device, which method comprises: forming a dielectric interlayer, comprising an upper surface, on a level above a semiconductor substrate; forming an opening in the dielectric interlayer extending to the upper surface, depositing a barrier layer, comprising an alloy, a refractory metal and one or more of Ni, Co, Ag, Au, Pd, Pt, Rh or Cu, in the opening and on the upper surface of the dielectric interlayer; depositing a Cu seed layer on a surface of barrier layer; and electroplating or electroless plating Cu or a Cu-base alloy on the seed layer on the upper surface of the dielectric layer.

A further aspect of the present invention is a semiconductor device comprising: a semiconductor substrate; a dielectric interlayer formed on a level above the semiconductor substrate, which dielectric interlayer has an upper surface and an opening therein filled with conductive material forming an interconnect pattern, wherein the interconnect pattern comprises a multilayer structure comprising: (a) a layer of a refractory metal having an upper surface; (b) an intermediate layer comprising the refractory metal and one or more elements selected from the group consisting of Ni, Co, Ag, Au, Pd, Pt, Rh and Cu, wherein the concentration of the refractory metal decreases across the intermediate layer from the upper surface of the refractory metal layer from 100% to 0% and the concentration of one or more of Ni, Co, Ag, Au, Pd, Pt, Rh or Cu increases from 0% to 100% from the upper surface of the intermediate layer; and (c) a layer containing one or more Ni, Co, Ag, Au, Pd, Pt, Rh or Cu.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
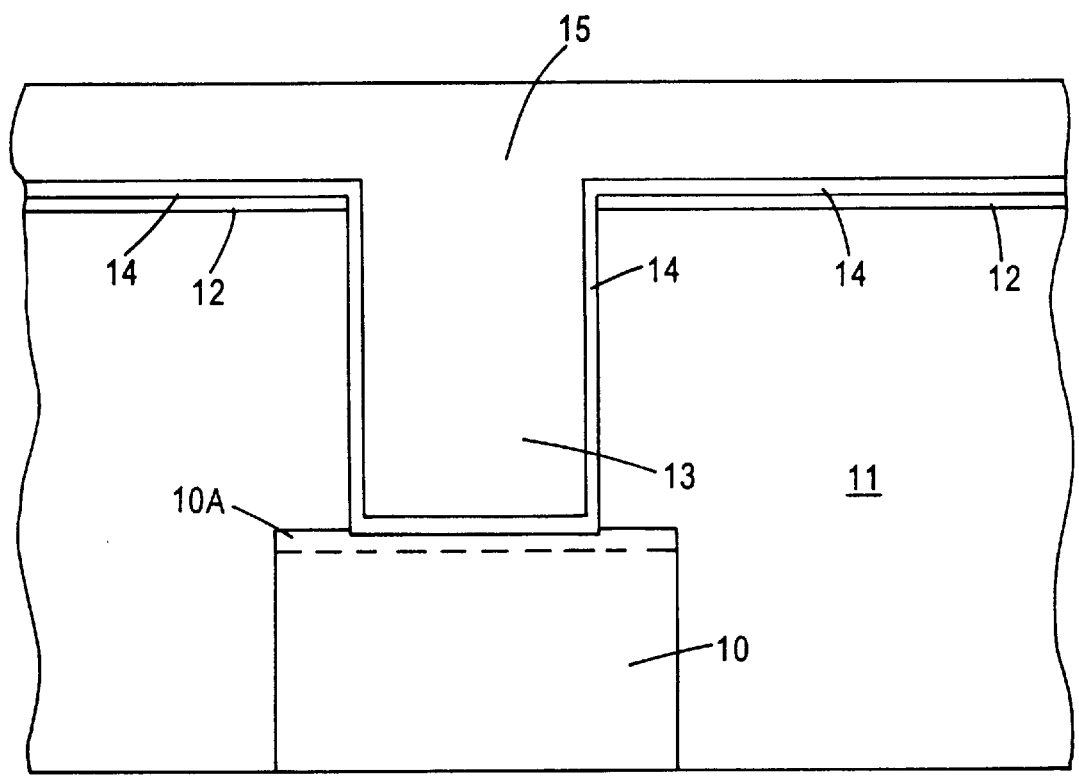
FIGS. 1 and 2 schematically depict sequential phases in forming an interconnect pattern in accordance with an embodiment of the present invention.

The present invention addresses and solves the reliability problems encountered when attempting to provide a high conductivity interconnect pattern by electroless plating or electroplating Cu or a Cu alloy to fill via, contact and/or trench openings in a dielectric interlayer, particularly in a cost effective and efficient manner with increased throughput. The present invention addresses and solves the poor step coverage problem attendant upon depositing a catalytic seed layer, such as a Cu seed layer, particularly in filling high aspect ratio openings for vias, contacts, and/or trenches, thereby enabling the effective and reliable utilization of electroplating or electroless plating Cu or a Cu-base alloy in forming an interconnect pattern. The present invention also addresses and solves the adhesion and diffusion problems attendant upon utilizing Cu in an interconnect pattern. The present invention also addresses and solves the poor wettability problem of a barrier metal for seed layer deposition.

In accordance with the present invention, a dielectric interlayer is formed at a level above a semiconductor substrate and at least one opening for a via, contact and/or trench formed therein employing conventional photolithographic and etching techniques, preferably by a single or dual damascene technique. Such an opening can comprise a lower contact or via opening section in communication with an upper trench opening section formed by a dual damascene techniques.

In accordance with the present invention, a seed layer comprising an alloy of a refractory metal and one or more catalytically active metals such as nickel (Ni), cobalt (Co), silver (Ag), gold (Au), palladium (Pd), platinum (Pt), rhodium (Rh) or Cu, preferably Cu, is deposited in the opening and on the dielectric interlayer. The seed layer alloy advantageously serves not only as a catalyst or base metal for subsequent electroless plating or electroplating, but as a diffusion barrier preventing Cu from diffusing through the underlying dielectric material, and as an adhesion layer preventing delamination of subsequently electrolessly deposited or electroplated Cu. It has been found that an alloy of a refractory metal and catalytically active metal, such as Cu, exhibits superior step coverage, even in filling openings with high aspect ratios, vis-a-vis Cu alone. Accordingly, by depositing an alloy of a refractory metal and a catalytically active material for subsequent electroless deposition or electroplating of Cu, particularly an alloy of refractory metal and Cu, high aspect ratio openings can be reliably filled with a catalytic seed layer.

In forming the Cu-refractory metal alloy seed layer of the present invention, any of various refractory metals can be employed, such as tantalum (Ta), tungsten (W), molybdenum (Mo), hafnium (Hf), niobium (Nb), rhenium (Re), Osmium (Os), ruthenium (Ru), zirconium (Zr), technetium (Tc), titanium (Ti), vanadium (V), chromium (Cr) and manganese (Mn). It has been found particularly advantageous to employ alloys of Cu and Ta, W or Hf, since Ta, W and Hf have larger atomic numbers and, therefore, the alloys exhibit superior step coverage than Cu alone.

In an embodiment of the present invention, a dielectric interlayer comprising an upper surface is formed on a level above a semiconductor substrate. An opening is formed in the dielectric interlayer extending to the upper surface. A refractory metal and one or more Ni, Co, Ag, Au, Pd, Pt, Rh or Cu is co-deposited or phase-in deposited on the dielectric interlayer and in the opening. The resulting structure comprises a multilayer, i.e., three-layer structure, comprising: a first layer of the refractory metal; an intermediate layer formed on the upper surface of the refractory metal layer, which intermediate layer comprises the refractory metal and one or more of Ni, Co, Ag, Au, Pd, Pt, Rh and Cu, wherein the concentration of the refractory metal across the intermediate layer decreases from 100% to 0% from the upper surface of the refractory metal and the concentration of one or more Ni, Co, Ag, Au, Pd, Pt, Rh or Cu across the intermediate layer increases from 0% to 100% from the upper surface of the refractory metal layer; and a layer of one or more Ni, Co, Ag, Au, Pd, Pt, Rh or Cu on the intermediate layer.

In another embodiment of the present invention, an initial refractory metal barrier layer is deposited in the opening and on the upper surface of the dielectric interlayer. Such an initial barrier layer can comprise a refractory metal, alloy or compound thereof. Suitable barrier layers comprise an alloy of a refractory metal and one or more Ni, Co, Ag, Au, Pd, Pt, Rh or Cu. Introducing in the barrier material such elements as Ni, Co, Au, Pd, Pt, Rh or Cu improves the wetting capability of the barrier layer for the Cu seed layer deposition and finally the step coverage of the Cu seed layer. Suitable results have been obtained employing a barrier layer of Ta, W or a nitride thereof. Other barrier layer materials include Ti, W, WN, TiSiN or TaSiN.

In accordance with the present invention, one or more openings is formed in a dielectric interlayer and filled with Cu or a Cu-base alloy by electroless deposition or electroplating to form a conductive plug filling a via or contact opening and/or a conductive line filling a trench opening. One or more of the openings can comprise a lower contact or via opening section in communication with an upper trench opening section formed by a dual damascene technique. Upon electroless plating or electroplating Cu or a Cu-base alloy, a thin layer is typically formed on the seed layer and on the upper surface of the dielectric interlayer. Subsequent processing in accordance with the present invention comprises planarization, as by CMP. Subsequent to planarization, a barrier layer, such as $Si_3N_4$, is deposited to completely encapsulate the resulting conductive plug filling a via or contact opening and/or conductive line filling a trench opening.

In another embodiment of the present invention, subsequent to forming a conductive plug filling a contact or via opening, a second dielectric interlayer is formed on the first dielectric interlayer, and a trench opening formed in the second dielectric interlayer communicating with the conductive plug. Another catalytic seed layer, such as an alloy of Cu and a refractory metal, is then deposited in the trench opening, on the upper surface of the conductive plug and on the upper surface of the second interlayer. Subsequently, Cu or a Cu-base alloy is electrolessly deposited or electroplated on the seed layer in the opening and on the upper surface of the second dielectric interlayer. This process can continue on in forming a plurality of dielectric interlayers with conductive patterns throughout the semiconductor device and interconnect patterns comprising electrolessly plated or electroplated Cu or a Cu-base alloy.

In the various embodiments of the present invention, a barrier layer can be deposited on the upper surface of a conductive line, which barrier layer can also serve as an anti-reflection and/or electromigration/stress migration suppression layer overlying the actual metal.

In another aspect of the present invention, an etch stop layer is deposited on the upper surface of a dielectric interlayer prior to depositing the seed layer. Such an etch stop layer can also serve as a CMP stopping layer, thereby preventing excessive polishing of the dielectric interlayer. The etch stop layer can comprise a conventional etch stop material, such as a silicon nitride or a silicon oxynitride, and can be deposited by conventional CVD techniques to a suitable thickness, such as about 1000 Å.

Although any of various refractory metals can be employed in forming the inventive alloy seed layer with a catalytically active metal such as Cu, particularly suitable results are achieved employing a seed layer comprising an alloy of Ta or W with Cu, wherein Cu ranges from about 0.5 at. % to about 99.5 at. %. Although other refractory metals are effective for the purposes of this invention, including Zr, Nb, Mo, Hf and Re, it has been found that Ta and W exhibit superior step coverage. In addition, CuTa alloys can be deposited in the amorphous structure with a high glass transition temperature. Such an amorphous structure is particularly effective in preventing Cu diffusion by eliminating diffusion paths, such as grain boundaries. Accordingly, it is also particularly suitable to employ Ta and W as in forming an initial barrier layer prior to depositing the seed layer.

Embodiments of the present invention are schematically illustrated in FIGS. 1 through 5, wherein similar elements bear similar reference numerals. Adverting to FIG. 1, an embodiment of the present invention comprises a semiconductor device having an interconnect pattern comprising wiring layer 10, representative of one of the conductive or metal layers in a multiple metal level semiconductor device. It should be understood that structure 10 is only a portion of many structures present on a semiconductor device.

A dielectric interlayer 11 separates different metal layers of a semiconductor device. Dielectric interlayer 11 is typically formed of an oxide, such as silicon dioxide. However, other materials, such as low dielectric constant materials, e.g., polymers such as polyimides, as well as other non-conductive materials, can be employed for dielectric interlayer 11.

Metal layer 10 may comprise a barrier metal layer 10A, such as TiN, which can also function as an anti-reflection and/or electromigration/stress migration suppression layer overlying the actual metal. However, the presence of such a barrier layer 10A is optional and, hence, omitted from the following figures for simplicity.

A thin etch stop layer 12 can optionally be applied on the upper surface of dielectric interlayer 11. Etch stop layer 12 can also serve as a CMP stopping layer to avoid excessive polishing of dielectric interlayer 11. Etch stop layer 12 is typically formed of an oxide material, such as silicon dioxide, a silicon nitride or a silicon oxynitride, and can be deposited in a conventional manner, as by CVD and may comprise silicon nitride.

Opening 13 is then formed in dielectric interlayer 11, and may serve as a contact or via opening or a trench opening. As one having ordinary skill in the art would recognize, if opening 13 is a contact opening, it would lead to an active region, such as a source/drain region formed in a semiconductor substrate rather than to conductive line 10. As illustrated, however, opening 13 constitutes a via opening.

A seed layer 14, comprising an alloy of a catalytically active metal, preferably Cu, and a refractory metal, preferably W or Ta, is deposited within opening 13 and on dielectric interlayer 11 or optional etch stop layer 12. Seed layer 14 exhibits superior step coverage and, hence, functions effectively as a catalyst for subsequent electroless deposition or electroplating of Cu or a Cu-base alloy thereon to form a reliable interconnection. Seed layer 14 also functions as a barrier layer to prevent diffusion of Cu ions, and an adhesion layer to prevent delamination of subsequently plated Cu or a Cu-base alloy. The seed layer can be sputter deposited or deposited by CVD to a suitable thickness, e.g., about 300 Å to about 1000 Å.

Subsequently, Cu or a Cu alloy, such as Cu-base alloy, e.g., a CuNi, CuMg, CuSn, CuZn or CuPd alloy, 15 is electrolessly plated or electroplated on catalytic seed layer 14 filling via opening 13 forming a conductive plug 15, shown in FIG. 2, and forming a thin layer, e.g., up to about 1.5 microns, extending on dielectric interlayer 11.

Figure 2:
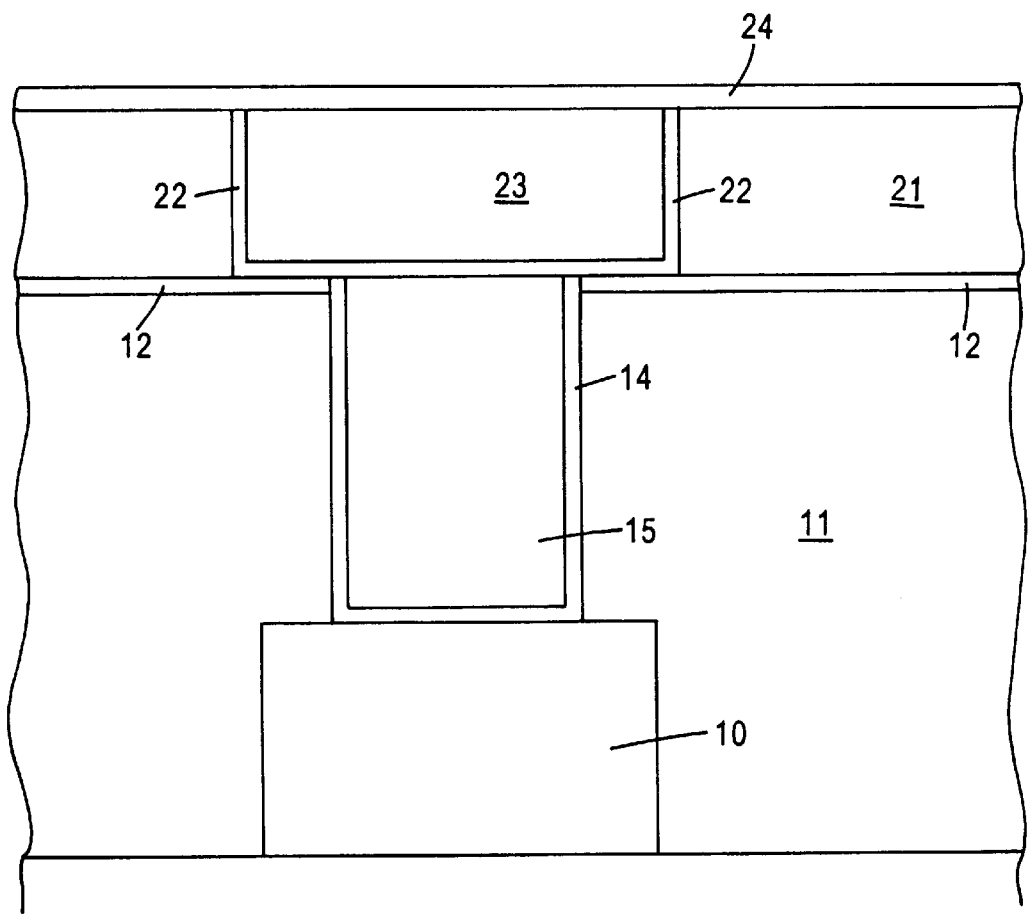

Subsequently, as illustrated in FIG. 2, the deposited Cu or Cu alloy layer 15 is subjected to planarization, preferably by CMP, to remove the thin plated Cu or Cu-base alloy layer and seed layer 14 from the upper surface of dielectric interlayer 11. A second dielectric interlayer 21 is deposited on the planarized surface and a trench opening formed in communication with conductive plug 15. Another catalytically active Cu-refractory metal alloy seed layer 22 is deposited in the trench opening in second dielectric interlayer 21 and on the upper surface of second dielectric interlayer 21. After deposition of seed layer 22, the trench is filled with Cu or a Cu-base alloy by electroless plating or electroplating, thereby forming a conductive line 23 in electrical contact with plug 15.

The upper surface of the deposited Cu or Cu-base alloy is then planarized, as by CMP, and a barrier layer 24, such as silicon nitride, deposited thereon. As one having ordinary skill in the art would recognize, the openings in the dielectric interlayers are formed by conventional photolithographic and etching techniques. Contact openings are filled with Cu or a Cu-base alloy to establish electrical contact with an active region on a semiconductor substrate, e.g., a source/drain region. Via openings are filled with Cu or Cu-base alloy to establish electrical contact between metal layers on different levels. Trench openings are filled with Cu or a Cu-base alloy to form a conductive line.

As one having ordinary skill in the art would also recognize, the fabrication of a multiple-metal layer structure on a semiconductor substrate is conventional in the art. Typically, dielectric materials, such as silicon dioxide, are utilized to separate conductive regions. Accordingly, it should be appreciated that the figures herein illustrate only portions of an exemplary semiconductor device which pertain to the practice of the present invention and which is not limited to the specific structures depicted herein.

Figure 3:
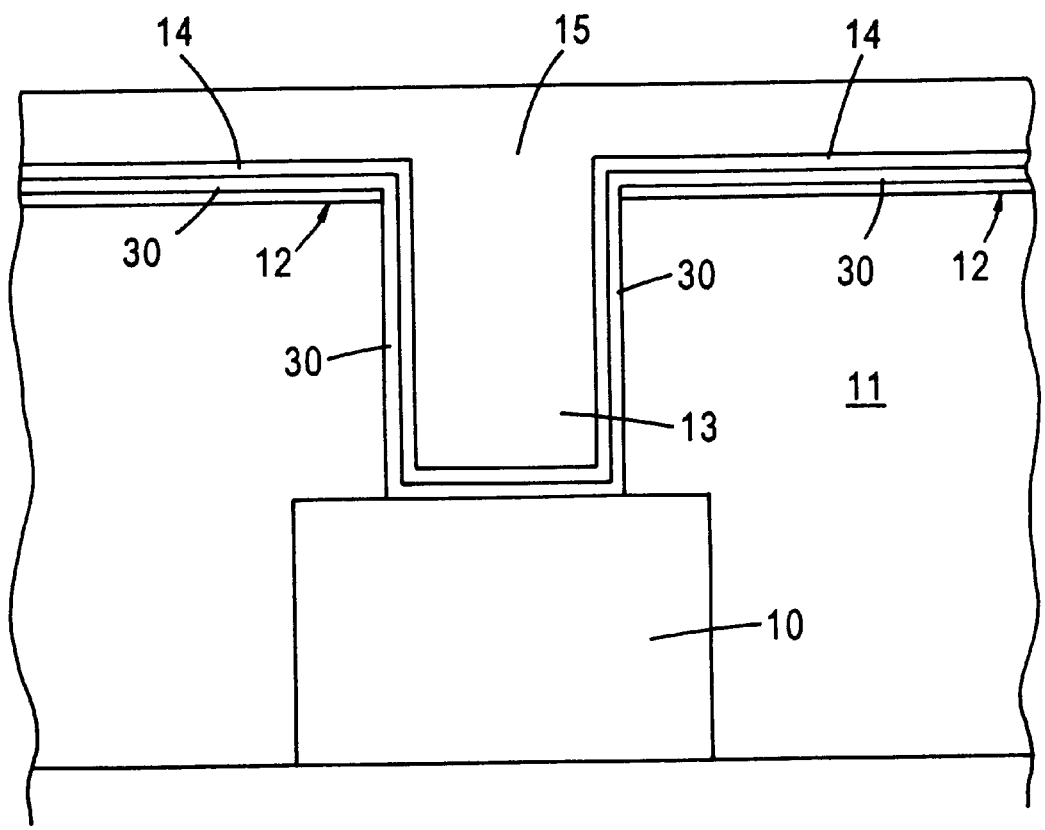
FIG. 3 schematically illustrates an interconnect pattern in accordance with another embodiment of the present invention.

Another embodiment of the present invention is illustrated in FIG. 3, wherein an initial barrier layer 30 is deposited in opening 13 and on dielectric interlayer 10 or optional etch stop layer 12, for additional prevention of Cu migration. Barrier layer 30 can comprise a refractory metal, refractory metal alloy or refractory metal compound, preferably Ta, W or a nitride thereof. Subsequently, catalytic seed layer 14, comprising an alloy of Cu and a refractory metal, is deposited on barrier layer 30 within opening 13 and on dielectric interlayer 11. Cu or a Cu-base alloy 15 is then electrolessly plated or electroplated on Cu-refractory metal catalytic seed layer 14 filling opening 13 and forming a thin layer on dielectric interlayer 11. Subsequent processing then continues in a manner similar to that illustrated in FIG. 2.

Figure 4:
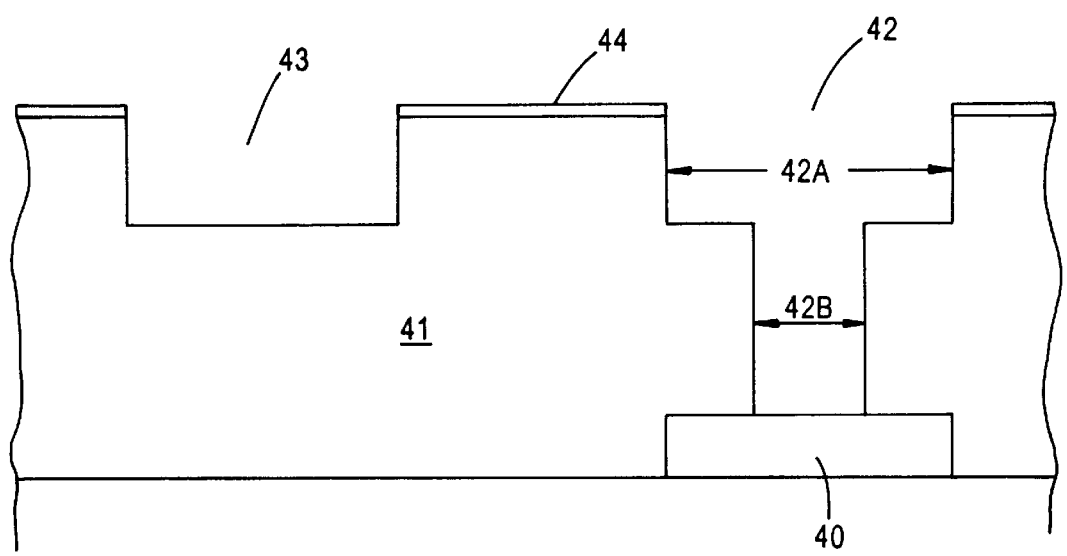
FIGS. 4 and 5 schematically depict sequential phases in forming an interconnect pattern in accordance with another embodiment of the present invention.
Figure 5:
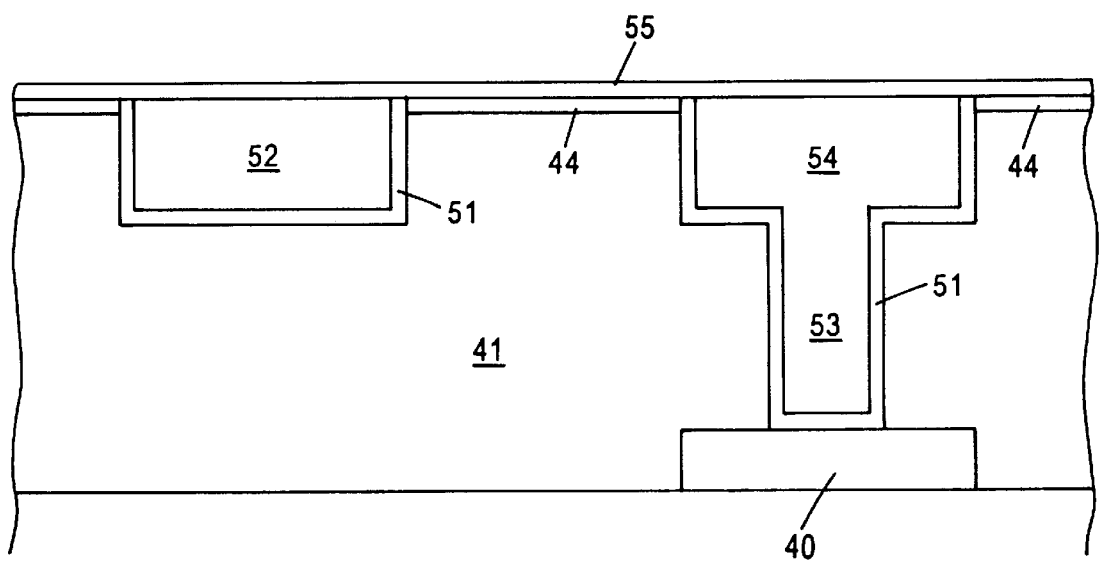

Another embodiment of the present invention is illustrated in FIGS. 4 and 5, wherein vias and trenches are simultaneously formed and filled. Adverting to FIG. 4, reference numeral 40 represents a conductive line on which dielectric interlayer 41 is formed. Openings 42 and 43 are then formed in dielectric interlayer 41. Opening 43 is a trench opening while opening 42 comprises upper trench opening section 42A communicating with lower via opening section 42B, formed by a dual damascene technique, such as that disclosed in U.S. Pat. No. 4,789,648. Also illustrated in FIG. 4 is optional etch stop layer 44 formed on dielectric interlayer 41.

As shown in FIG. 5, catalytic seed layer 51, comprising Cu and a refractory metal alloy, such as Ta, is deposited in openings 42 and 43. Catalytic seed layer 51, although not shown in FIG. 5, is also formed during processing on optional etch stop layer 44, but removed during planarization.

Subsequently, Cu or a Cu-base alloy is electrolessly plated or electroplated in openings 42 and 43. As a result, trench opening 43 is filled to form conductive line 52. The lower via opening section 42B of opening 42 is filled to form conductive plug 53 and, simultaneously, the upper trench opening section 42A of opening 42 is filled to form conductive line 54. Planarization is then effected, as by CMP, and etch stop layer 55 deposited thereon.

Although the present invention has been illustrated in terms of vias and trenches, the present invention can be readily extended to contact openings as well. In such instances, the underlying region would not be a metal layer, but a doped contact region or silicide region of a contact. Thus, interconnect patterns implementing the present invention can extend to those conductive regions referred to as contacts.

In accordance with the present invention, a catalytic seed layer comprising a Cu-refractory metal alloy exhibiting superior step coverage, is electrolessly plated or electroplated in openings, including high aspect ratio openings. In addition, the seed layer is oxidation resistant. Accordingly, it is not necessary to maintain the deposited seed layer under vacuum until Cu or a Cu-base alloy is plated thereon, although a vacuum can also be maintained during processing.

The solutions employed in the present invention for electroless deposition of Cu or electroplating of Cu or a Cu alloy are conventional and, hence, not described herein in detail. It has been found particularly suitable to employ an electroless solution comprising copper sulfate to supply $Cu^{2+}$ cations, ethylenediaminetetraacetic acid (EDTA) as a complexing agent for $Cu^{2+}$ cations, quaternary ammonium hydroxides or potassium hydroxide (KOH) to supply the $OH^-$ ions, formaldehyde (HCHO) or glyoxylic acid as a reducing agent, RHODAFAC RE 610 or a polyethylene glycol as a surfactant and wetting agent, and ammonium cyanide or 2,2"-dipyridyl as a stabilizer and ductility promoter.

EXAMPLE 1

Two Cu—Ta alloys were prepared in the following atomic percentages:

| (Alloy A) | (Alloy B) |
| --- | --- |
| Cu . . . about 20 at. % | Cu . . . about 80 at. % |
| Ta . . . about 80 at. % | Ta . . . about 20 at. % |

Alloys (A) and (B) above were sputter deposited on the surface of a silicon oxide dielectric layer and served as catalytic seed/barrier layers. The resistivity of the sputter deposited film of Alloy A was determined to be about 95 $\mu\Omega$cm. The resistivity of sputter deposited Alloy B was determined to be about 40 $\mu\Omega$cm. Cu films were then electroplated in a CUBATH™ acid plating bath on Alloy A and Alloy B. Pulse deposition techniques were used to plate Cu with a duty cycle of about 50–90%, at a frequency of about 10–1000 Hz and a cathodic current density amplitude of about 15–30 mA/cm$^2$. The plated Cu films in both cases exhibited good adhesion, fine grain structures, low resistivities and good thickness uniformity. The resistivity of Cu films deposited on Alloy A and Alloy B were in the range of about 1.8 to 1.9 $\mu\Omega$cm with a thickness uniformity of about 5–7%, 1 $\sigma$.

EXAMPLE 2

Alloy A and Alloy B, as described in Example 1, were sputter deposited on the surface of a silicon oxide dielectric layer and served as catalytic seed/barrier layers. Cu films were electrolessly plated on sputter deposited Alloy A and sputter deposited Alloy B. Electroless plating was conducted at a deposition temperature of about 50° C. to about 80° C. employing plating baths containing about 5–10 g/l $CuSO_4 \cdot 5H_2O$, about 10–70 g/l EDTA, about 5–10 ml/l (about 37% solution) HCHO, with a pH of about 11.8–13.3. In each case, the plated Cu film exhibited good adhesion, a fine grain structure, low resistivity and good thickness uniformity. The resistivity and thickness uniformity of electrolessly plated Cu films on Cu—Ta seed/barrier layers were about the same as for the electroplated films of Example 1.

The present invention comprises a conventional semiconductor substrate, such as monocrystalline silicon, and conventional dielectric layers, such as silicon dioxide layers, formed in a conventional manner as by thermal oxidation of a deposited silicon layer, PECVD, thermal enhanced CVD, spin-on techniques, and silicon dioxide derived from deposited tetraethyl orthosilicate (TEOS). In the previous descriptions, numerous specific details are set forth, such as specific materials, structures, chemicals, processes, etc., in order to provide a though understanding of the present invention. However, as one having ordinary skill in the art would recognize, the present invention can be practiced without resorting to the details specifically set forth. In other instances, well known processing structures have not been described in detail in order not to unnecessarily obscure the present invention.

It should be recognized that interconnect patterns of the present invention comprising Cu or a Cu-base alloy electrolessly plated or electroplated enjoy the advantages associated with Cu for conductive paths in a semiconductor device. The present invention is not limited to the size of the device or openings, but can advantageously be applied for submicron technology, particularly wherein openings are formed with high aspect ratios. Electroless plating or electroplating can be performed as a batch process in which a substantial number of wafers are immersed in a wet bath at the same time.

The present invention provides a cost effective, efficient technique for forming a high conductivity interconnect pattern with high reliability by electroplating or electrolessly plating Cu or a Cu-base alloy on a seed layer comprising an alloy of Cu and a refractory metal, such as Ta or W. In accordance with the present invention, interconnection patterns are reliably formed with filled openings for contacts and vias having an aspect ratio of 4:1 and greater, and filled trench openings having a contact aspect ratio of about 2:1 and greater. The use of a Cu-refractory metal alloy seed layer advantageously provides superior step coverage, thereby ensuring reliability, serves as a barrier layer and provides superior adhesion. An initial barrier layer comprising a refractory metal, alloy or compound thereof, can also be initially deposited, and the Cu-refractory metal alloy seed layer deposited thereon.

Only the preferred embodiment of the invention and example of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising:
    a semiconductor substrate;
    a dielectric interlayer formed on a level above the semiconductor substrate, which dielectric interlayer has an upper surface and an opening therein filled with conductive material forming an interconnect pattern, wherein the interconnect pattern comprises:
        a seed layer comprising an alloy containing a refractory metal and one or more of nickel, cobalt, silver, gold, platinum, rhodium or copper deposited in the opening; and
        a copper or copper-base alloy electroplated or electrolessly plated on the seed layer in the opening.

2. The semiconductor device according to claim 1, wherein the interconnect pattern comprises copper plated on the seed layer.

3. A semiconductor device comprising:
    a semiconductor substrate;
    a dielectric interlayer formed ona level above the semiconductor substrate, which dielectric interlayer has an upper surface and an opening therin filled with conductive material forming an interconnect pattern, wherein the interconnect pattern comprises:
        a seed layer comprising an alloy containing about 0.5 at. % to about 99.5 at. % copper and a refractory metal; and
        a copper or copper-base alloy electroplated or electroless plated on the seed layer in the opening.

4. The semiconductor device according to claim 3, wherein the refractory metal comprises tantalum or tungsten.

5. The semiconductor device according to claim 4, wherein the refractory metal comprises tantalum.

6. The semiconductor device according to claim 3, wherein the interconnect pattern further comprises a barrier layer containing a refractory metal, alloy or compound thereof, formed in the opening and on the upper surface of the dielectric interlayer, and the seed layer is formed on the barrier layer.

7. The semiconductor device according to claim 6, wherein the barrier layer comprises tantalum, tungsten or a nitride thereof.

8. The semiconductor device according to claim 3, wherein the interconnect pattern comprises one or more filled openings forming a conductive plug in a contact or via opening and/or a conductive line in a trench opening.

9. The semiconductor device according to claim 8, wherein the contact or via and trench opening has an aspect ratio of about 2:1 or greater.

10. A semiconductor device comprising:
    a semiconductor substrate;
    a dielectric interlayer formed on a level above the semiconductor substrate, which dielectric interlayer has an upper surface and an opening therein filled with conductive material forming an interconnect pattern, wherein the interconnect pattern comprises:

a seed layer comprising an alloy containing a refractory metal and one or more of nickel, cobalt, silver, gold, palladium, platinum, rhodium or copper deposited in the opening; and a copper or copper-base alloy electroplated or electrolessly plated on the seed layer in the opening, further comprising a silicon nitride barrier layer formed on the electroless plated or electroplated copper or copper-base alloy.

11. A semiconductor device comprising:

a semiconductor substrate;

a dielectric interlayer formed on a level above the semiconductor substrate, which dielectric interlayer has an upper surface and an opening therein filled with conductive material forming an interconnect pattern, wherein the interconnect pattern comprises:

a seed layer comprising an alloy containing a refractory metal and one or more of nickel, cobalt, silver, gold, palladium, platinum, rhodium or copper deposited in the opening; and a copper or copper-base alloy electroplated or electrolessly plated on the seed layer in the opening, further comprising an etch stop layer on the upper surface of the dielectric interlayer.

12. A method of manufacturing a semiconductor substrate, which method comprises:

forming a dielectric interlayer, comprising an upper surface, on a level above a semiconductor substrate;

forming an opening in the dielectric interlayer extending to the upper surface;

depositing a seed layer, comprising an alloy of a refractory metal and one or more of nickel, cobalt, silver, gold, platinum, rhodium or copper, in the opening and on the upper surface of the dielectric interlayer; and electroplating or electroless plating copper or a copper-base alloy on the seed layer in the opening and forming a layer on the upper surface of the dielectric interlayer.

13. The method according to claim 12, comprising electroplating or electroless plating of copper on the seed layer.

14. The method according to claim 12, comprising sputter depositing the seed layer.

15. A method of manufacturing a semiconductor substrate, which method comprises:

forming a dielecric interlayer, comprising an upper surface, on a level above a semiconductor substrate;

forming an opening in the dielectric interlayer extending to the upper surface;

depositing a seed layer comprising an alloy containing of about 0.5 at. % to about 99.5 at. % copper and a refractory metal, in the opening and on the upper surface of the dielectric interlayer; and electroplating or electroless plating copper or a copper-base alloy on the seed layer in the opening and forming a layer on the upper surface of the dielectric interlayer.

16. The method according to claim 15, wherein the refractory metal comprises tantalum.

17. A method of manufacturing a semiconductor substrate, which method comprises:

forming a dielectric interlayer, comprising an upper surface, on a level above a semiconductor substrate;

forming an opening in the dielectric interlayer extending to the upper surface;

depositing a barrier layer containing a refractory metal, alloy or compound thereof, in the opening and on the upper surface of the dielectric interlayer;

depositing a seed layer, comprising an alloy of a refractory metal and one or more of nickel, cobalt, silver, gold, palladium, platinum, rhodium or copper, on the barrier layer in the opening and on the upper surface of the dielectric interlayer; and electroplating or electroless plating copper or a copper-base alloy on the seed layer in the opening and forming a layer on the upper surface of the dielectric interlayer.

18. The method according to claim 17, wherein the barrier layer comprises tantalum, tungsten or a nitride thereof.

19. The method according to claim 15, comprising forming one or more openings in the dielectric interlayer and filling each opening to form a conductive plug in a contact or via opening and/or a conductive line in a trench opening.

20. The method according to claim 19, wherein the contact or via and trench opening has an aspect ratio of about 2:1 or greater.

21. A method of manufacturing a semiconductor substrate, which method comprises:

forming a dielectric interlayer, comprising an upper surface, on a level above a semiconductor substrate;

forming an etch stop layer on the upper surface of the dielectric interlayer;

forming an opening in the dielectric interlayer extending to the upper surface;

depositing a seed layer, comprising an alloy of a refractory metal and one or more of nickel, cobalt, silver, gold, palladium, platinum, rhodium or copper, in the opening and on the etch stop layer on the upper surface of the dielectric interlayer; and electroplating or electrolyze plating copper or a copper-base alloy on the seed layer in the opening and forming a layer on the upper surface of the dielectric interlayer.

22. The method according to claim 15, further comprising planarizing to remove the copper or copper-base alloy layer and seed layer from the upper surface of the dielectric interlayer.

23. A method of manufacturing a semiconductor substrate, which method comprises:

forming a dielectric interlayer, comprising an upper surface, on a level above a semiconductor substrate;

forming an etch stop layer on the upper surface of the dielectric interlayer;

forming an opening in the dielectric interlayer extending to the upper surface;

depositing a seed layer, comprising an alloy of a refractory metal and one or more of nickel, cobalt, silver, gold, palladium, platinum, rhodium or copper, in the opening and on the etch stop layer of on the surface of the dielectric interlayer; and electroplating or electroless plating copper or a copper-base alloy on the seed layer in the opening and forming a layer on the upper surface of the dielelctric interlayer.

24. The method according to claim 19, wherein at least one opening comprises a contact or via opening, which method further comprises:

electroplating or electroless plating of copper or a copper-base alloy to form a conductive plug;

planarizing;

depositing another dielectric interlayer having an upper surface;

forming a trench opening in said another dielectric interlayer communicating with the conductive plug;

depositing a seed layer, comprising an alloy of a refractory metal and one or more of nickel, cobalt, silver, gold, palladium, platinum, rhodium or copper, in the trench opening and on the upper surface of said another dielectric interlayer; and filling the trench opening to form a conductive line by electroplating or electroless plating of copper or a copper-base alloy on the seed layer to form a conductive line in electrical contact with the conductive plug.

25. The method according to claim 19, comprising:

forming an opening comprising a lower contact or via opening section in communication with an upper trench opening section by a damascene technique;

depositing a seed layer, comprising an alloy of a refractory metal and one or more of nickel, cobalt, silver, gold, palladium, platinum, rhodium or copper, in the opening; and filling the opening by electroplating or electroless plating of copper or a copper-base alloy on the seed layer to simultaneously form a conductive line in the upper trench opening section in electrical contact with a conductive plug in the lower contact or via opening section.

26. A semiconductor device comprising:

a semiconductor substrate;

a dielectric interlayer formed on a level above the semiconductor substrate, which dielectric interlayer has an upper surface and an opening therein filled with conductive material forming an interconnect pattern, wherein the interconnect pattern comprises a multilayer structure comprising:

(a) a layer of a refractory metal having an upper surface;

(b) an intermediate layer comprising the refractory metal and one or more elements selected from the group consisting of Ni, Co, Ag, Au, Pd, Pt, Rh and Cu, wherein the concentration of the refractory metal decreases across the intermediate layer from the upper surface of the refractory metal layer from 100% to 0% and the concentration of one or more of Ni, Co, Ag, Au, Pd, Pt, Rh or Cu increases from 0% to 100% from the upper surface of the intermediate layer; and (c) a layer containing one or more Ni, Co, Ag, Au, Pd, Pt, Rh or Cu.

27. The semiconductor device according to claim 26, wherein the interconnection pattern further comprises copper or a copper alloy electroplated or electroless plated on the multi-layer structure.

28. The semiconductor device according to claim 24, wherein the interconnect pattern further comprises a barrier layer under the multi-layer structure.

29. The semiconductor device according to claim 24, wherein the seed layer comprises an alloy of tantalum or tungsten with copper.

30. A semiconductor device comprising:

a semiconductor substrate;

a dielectric interlayer formed on a level above the semiconductor substrate, which dielectric interlayer has an upper surface and an opening therein filled with conductive material forming an interconnect pattern, wherein the interconnect pattern comprises:

a seed layer comprising an alloy containing a refractory metal and one or more of nickel, cobalt, silver, gold, palladium, platinum, rhodium or copper deposited in the opening; and a copper or copper-base alloy electroplated or electrolessly plated on the seed layer in the opening, wherein the dielectric interlayer comprises an oxide.

31. The semiconductor device according to claim 30, wherein the oxide comprises silicon dioxide.

32. A method of manufacturing a semiconductor substrate, which method comprises:

forming a dielectric interlayer, comprising an upper surface, on a level above a semiconductor substrate;

forming an opening in the dielectric interlayer extending to the upper surface;

depositing a seed layer, comprising an alloy of a refractory metal and one or more of nickel, cobalt, silver, gold, palladium, platinum, rhodium or copper, in the opening and on the upper surface of the dielectric interlayer; and electroplating or electroless plating copper or a copper-base alloy on the seed layer in the opening and forming a layer on the upper surface of the dielectric interlayer, wherein the dielectric interlayer comprises an oxide.

33. The method according to claim 32, wherein the oxide comprises silicon dioxide.

34. A semiconductor device comprising:

a semiconductor substrate;

a dielectric interlayer formed on a level above the semiconductor substrate, which dielectric interlayer has an upper surface and an opening therein filled with conductive material forming an interconnect pattern, wherein the interconnect pattern comprises:

a seed layer comprising an alloy containing a refractory metal and one or more of nickel, cobalt, silver, gold, palladium, platinum, rhodium or copper deposited in the opening; and a copper or copper-base alloy electroplated or electrolessly plated on the seed layer in the opening, wherein the copper or copper-based alloy is electroplated or electroless plated directly on the seed layer in the opening.

35. A method of manufacturing a semiconductor substrate, which method comprises:

forming a dielectric interlayer, comprising an upper surface, on a level above a semiconductor substrate;

forming an opening in the dielectric interlayer extending to the upper surface;

depositing a seed layer, comprising an alloy of a refractory metal and one or more of nickel, cobalt, silver, gold, palladium, platinum, rhodium or copper, in the opening and on the upper surface of the dielectric interlayer; and electroplating or electroless plating copper or a copper-base alloy on the seed layer in the opening and forming a layer on the upper surface of the dielectric interlayer, comprising electroplating or electroless plating copper or a copper-based alloy directly on the seed layer in the opening.

36. A semiconductor device comprising:

a semiconductor substrate;

a dielectric interlayer formed on a level above the semiconductor substrate, which dielectric interlayer has an upper surface and an opening therein filled with conductive material forming an interconnect pattern, wherein the interconnect pattern comprises:

a seed layer comprising an alloy containing a refractory metal and one or more of nickel, cobalt, silver, gold, palladium, platinum, rhodium or copper deposited in the opening; and a copper or copper-base alloy electroplated or electrolessly plated on the seed layer in the opening, wherein the refractory metal comprises tantalum or tungsten.

37. A method of manufacturing a semiconductor substrate, which method comprises:

forming a dielectric interlayer, comprising an upper surface, on a level above a semiconductor substrate;

forming an opening in the dielectric interlayer extending to the upper surface;

depositing a seed layer, comprising an alloy of a refractory metal and one or more of nickel, cobalt, silver, gold, palladium, platinum, rhodium or copper, in the opening and on the upper surface of the dielectric interlayer; and electroplating or electroless plating copper or a copper-base alloy on the seed layer in the opening and forming a layer on the upper surface of the dielectric interlayer, wherein the refractory upper surface of the dielectric interlayer, wherein the refractory metal comprises tantalum or tungsten.

* * * * *